United States Patent [19]

Yoshida

[11] 4,347,481
[45] Aug. 31, 1982

[54] PULSE WIDTH MODULATED SIGNAL AMPLIFIER

[75] Inventor: Tadao Yoshida, Tokyo, Japan

[73] Assignee: Sony Corporation, Tokyo, Japan

[21] Appl. No.: 151,266

[22] Filed: May 19, 1980

[30] Foreign Application Priority Data

May 24, 1979 [JP] Japan ................................. 54-64178

[51] Int. Cl.³ ............................................. H03F 3/38
[52] U.S. Cl. ..................................... 330/251; 330/10; 330/207 A; 330/297
[58] Field of Search ..................... 330/10, 149, 207 A, 330/251, 296, 297

[56] References Cited

U.S. PATENT DOCUMENTS 3,999,143 12/1976 Yoshida et al. ................. 330/207 A

*Primary Examiner*—James B. Mullins
*Assistant Examiner*—Gene Wan
*Attorney, Agent, or Firm*—Hill, Van Santen, Steadman, Chiara & Simpson

[57] ABSTRACT

A pulse width modulated signal amplifier includes a first DC voltage source having first and second terminals, first and second switching transistors each having a control electrode, the main current path of which is connected in series between the first and second terminals of the first DC voltage source, the connection point of which is connected to an output terminal, a signal input circuit for supplying a pulse width modulated signal to the control electrodes of the first and second switching transistors, a low pass filter having an input connected to the output terminal and an output to be connected to a load, a second DC voltage source having first and second terminals, the output voltages of which are lower than those of the first and second terminals of the first DC voltage source, a first circuit including a first diode and connected between the first terminal of the second DC voltage source and the output terminal, and a second circuit including a second diode connected between the second terminal of the second DC voltage source and the output terminal, thereby to reduce amplitude distortion in the output voltage of the output terminal.

5 Claims, 12 Drawing Figures

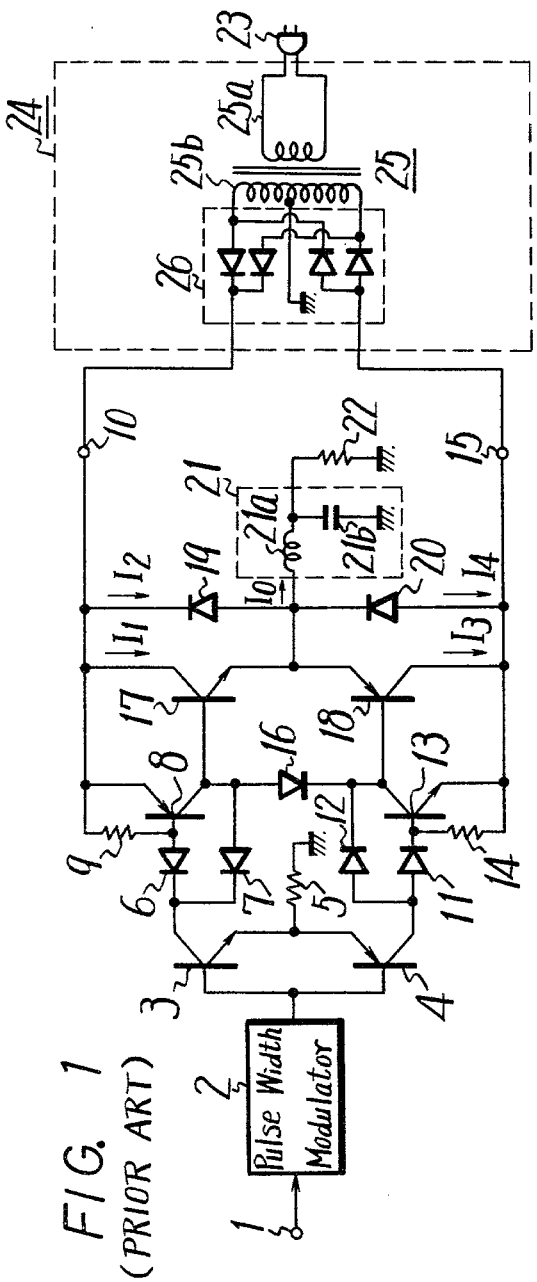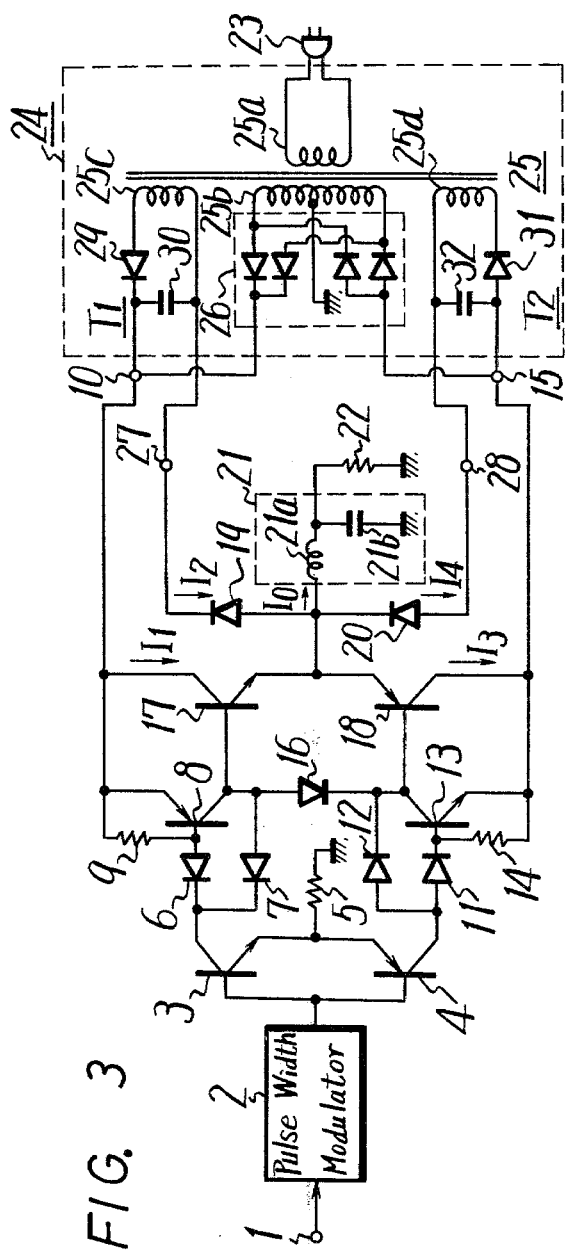
FIG. 1 (PRIOR ART)
FIG. 3

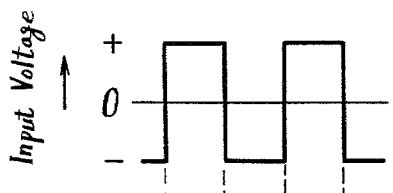
FIG. 2A
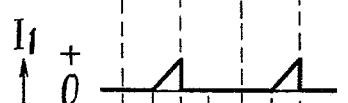
FIG. 2B
FIG. 2C
FIG. 2D
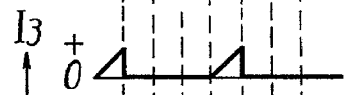
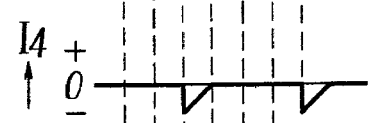
FIG. 2E
FIG. 2F
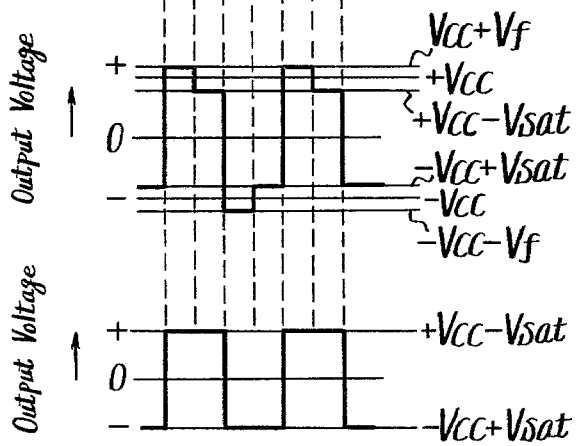
FIG. 2G
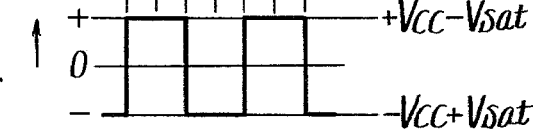
FIG. 2H

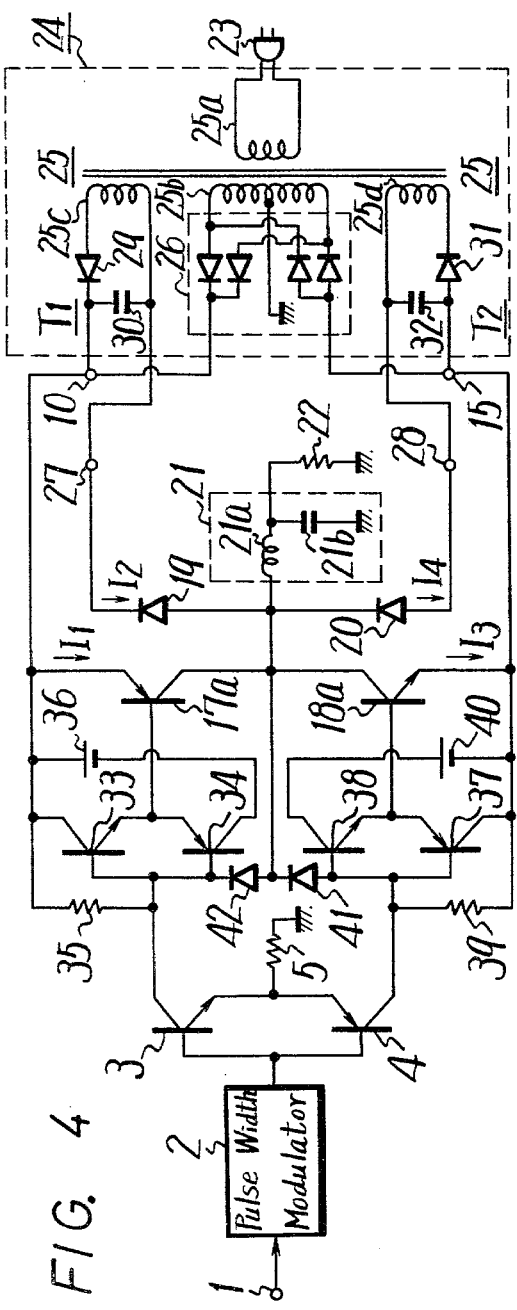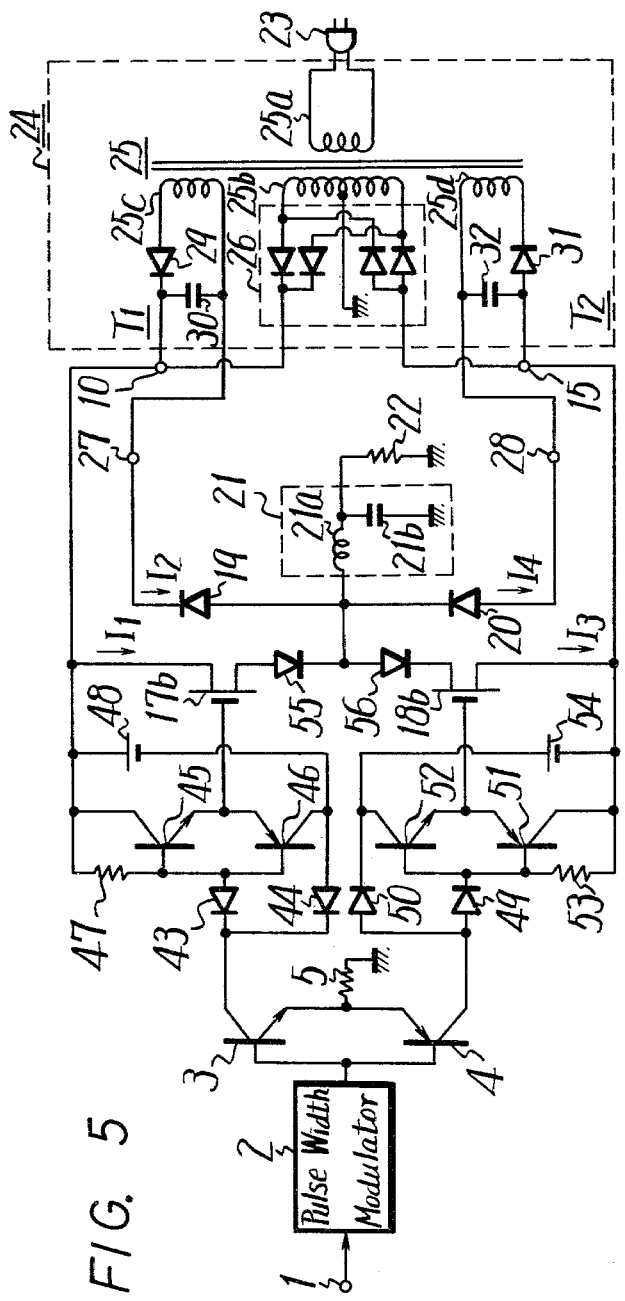
F/G. 4       F/G. 5 ered simply to as a PWM signal amplifier), and is directed more particularly to a PWM signal amplifier which reduces the amplitude distortion in an output voltage.

PULSE WIDTH MODULATED SIGNAL AMPLIFIER

BACKGROUND OF THE INVENTION

1. Field of the Invention

This invention relates generally to a pulse width modulated signal amplifier (which will be hereinafter referred simply to as a PWM signal amplifier), and is directed more particularly to a PWM signal amplifier which reduces the amplitude distortion in an output voltage.

2. Description of the Prior Art

In the art it is known that since a pair of diodes are connected in parallel to a switching transistor so as to flow a return current from a choke coil of a low pass filter to a current souce, the amplitude of an output voltage from a PWM signal amplifier is different between the time when the diodes are conductive and the time when the switching transistor is conductive and hence the amplitude distortion is caused thereby.

In order to avoid the above defect, there has been proposed the U.S. Pat. No. 3,999,143 entitled in Pulse Width Modulated Signal Amplifier and assigned to the same applicant as that of the present application. In this U.S. Patent, a plurality of diodes other than the return current diodes are used to reduce the amplitude distortion of an output voltage from the PWM signal amplifier.

In this U.S. Patent, however, a relatively expensive diode for high speed operation is necessary as the diode for removing the amplitude distortion, so that the amplifier becomes expensive naturally.

OBJECTS AND SUMMARY OF THE INVENTION

Accordingly, an object of the present invention is to provide a PWM signal amplifier free of the defect encountered in the prior art.

Another object of the invention is to provide a PWM signal amplifier which is simple in circuit construction but removes an amplitude distortion.

In accordance with an aspect of the present invention, a PWM signal amplifier is provided, which includes a first DC voltage source having first and second terminals, first and second switching transistors each having a control electrode, the main current path of which is connected in series between the first and second terminals of the first DC voltage source, the connection point of which is connected to an output terminal, a signal input circuit for supplying a PWM signal to the control electrodes of the first and second switching transistors, a low pass filter having an input connected to the output terminal and an output to be connected to a load, a second DC voltage source having first and second terminals, the output voltages of which are lower than those of the first and second terminals of the first DC voltage source, a first circuit including a first diode and connected between the first terminal of the second DC voltage source and the output terminal, and a second circuit including a second diode connected between the second terminal of the second DC voltage source and the output terminal, thereby to reduce amplitude distortion in the output voltage of the output terminal.

The other objects, features and advantages of the present invention will be apparent from the following description taken in conjunction with the accompanying drawings through which the like references designate the same elements and parts.

BRIEF DESCRIPTION OF THE DRAWINGS

FIG. 1 is a connection diagram showing a prior art PWM signal amplifier;

FIGS. 2A to 2H are waveform diagrams used to explain the operation of the prior art PWM signal amplifier shown in FIG. 1 and also the PWM signal amplifier according to the present invention;

FIG. 3 is a connection diagram showing an example of the PWM signal amplifier according to the present invention; and FIGS. 4 and 5 are connection diagrams respectively showing other examples of the invention.

DESCRIPTION OF THE PREFERRED EMBODIMENTS

Before describing the present invention, a prior art PWM signal amplifier, which power-amplifies a PWM signal, will be now described with reference to FIG. 1.

In the example of FIG. 1, an aural signal is supplied to an input terminal 1 and then to the input side of a pulse width modulator 2 in which the carrier wave signal is pulse-width-modulated by the input aural signal. The PWM signal delivered from the pulse width modulator 2 is supplied to the bases of NPN and PNP type transistors 3 and 4. Thus, during the positive time period of the PWM signal, the transistor 3 becomes ON and, during the negative time period of the PWM signal, the transistor 4 becomes ON. In other words, the transistor 3 and 4 turn ON and OFF alternately. The emitters of transistors 3 and 4 are connected together and then grounded through a resistor 5. The collector of transistor 3 is connected to the cathodes of diodes 6 and 7. The anode of diode 6 is connected to the base of a PNP type transistor 8 whose base is also connected through a resistor 9 to a voltage source terminal 10 to which a positive DC voltage of $+V_{cc}$ is applied. The emitter of transistor 8 is connected also to the voltage source terminal 10 and the collector thereof is connected to the anode of diode 7. The collector of transistor 4 is connected to the anodes of diodes 11 and 12 and the cathode of diode 11 is connected to the base of an NPN type transistor 13 whose base is also connected through a resistor 14 to a voltage source terminal 15 to which a negative DC voltage of $-V_{cc}$ is applied. The emitter of transistor 13 is connected to the voltage source terminal 15, and the collector of transistor 13 is connected to the cathode of diode 12 and to the cathode of a diode 16 whose anode is connected to the collector of transistor 8. The collector of transistor 8 is connected to the base of an NPN type transistor 17 which serves as an switching element, and the collector of transistor 13 is connected to the base of a PNP type transistor 18 which serves also as another switching element. The collector of transistor 17 is connected to the voltage source terminal 10 and the collector of transistor 18 is connected to the voltage source terminal 15. The emitters of transistors 17 and 18 are connected together to the anode of a diode 19 which serves to process a return current and to the cathode of a diode 20 which also serves to process the return current. The cathode of diode 19 is connected to the voltage source terminal 10 and the anode of diode 20 is connected to the voltage source terminal 15, respectively. The connection point between the emitters of transistors 17 and 18 is connected through a low pass filter 21, which consists of a choke coil 21a and a capacitor 21b, to one end of a load resistor 22 such as a speaker whose other end is grounded.

The commercial voltage is applied through a power source plug 23 to a voltage source circuit 24, namely across a primary winding 25a of a voltage source transformer 25, which forms the voltage source circuit 24. An Ac voltage which is induced across a secondary winding 25b of transformer 25 and proportional to the winding ratio between the primary and secondary windings 25a and 25b, is applied to the input side of a bridge rectifier circuit 26 whose output sides are connected to the voltage source terminals 10 and 15 to supply thereto the positive DC voltage $+V_{cc}$ and negative DC voltage $-V_{cc}$, respectively.

With the prior art PWM signal amplifier shown in FIG. 1, when the PWM signal shown in FIG. 2A which is delivered from the pulse width modulator 2, is supplied to the bases of transistors 3 and 4, the bases of switching transistors 17 and 18 are respectively supplied through the transistors 8 and 13 with a PWM signal same as the former PWM signal in phase so that both the transistor's 17 and 18 are made ON and OFF alternately. Accordingly, at the output terminal i.e. connection point between the emitters of transistors 17 and 18, obtained is an amplified PWM signal which is in turn supplied through the low pass filter 21 to the speaker 22. Thus, the aural signal applied to the input terminal 1 is reproduced from the speaker 22.

With the prior art PWM signal amplifier shown in FIG. 1, if a PWM signal with the waveform shown in, for example, FIG. 2A is supplied to the bases of transistors 17 and 18, currents I1, I2, I3 and I4 flowing through the transistor 17, return current processing diode 19, transistor 18 and return current processing diode 20 become as shown in FIGS. 2B, 2C, 2D and 2E, respectively. When the current I1 shown in FIG. 2B flows through the transistor 17, an output voltage VO appearing at the connection point between the emitters of transistor 17 and 18 has such a level of $+V_{cc}-V_{sat}$ (where $V_{sat}$ represents the saturation voltage between the collector and emitter of the transistor) as shown in FIG. 2G. When the current I2 shown in FIG. 2C flows through the return current processing diode 19, the level of output voltage VO becomes $+V_{cc}-V_f$ (where $V_f$ represents the drop voltage of the diode in the forward direction) as shown in FIG. 2G. When the current I3 shown in FIG. 2D flows through the transistor 18, the level of output voltage VO becomes $-V_{cc}+V_{sat}$ as shown in FIG. 2G. When the current I4 shown in FIG. 2E flows through the return current processing diode 20, the level of output voltage VO becomes $-V_{cc}-V_f$ as shown in FIG. 2G. Totally, the waveform of the output voltage VO becomes non-linear or has a so-called step of $V_f+V_{sat}$. The fact that the step is generated in the waveform of output voltage VO in the amplitude direction causes distortion the output signal supplied to the load resistor such as speaker 22. A current IO, which is supplied from the connection point between the emitters of transistors 17 and 18 to the load resistor 22, is shown in FIG. 2F.

Now, an example of the PWM signal amplifier according to the present invention, which improves the distortion of output voltage VO in its amplitude direction, will be described with reference to FIG. 3 in which the same references as those in FIG. 1 designate the same elements and parts and their detailed description will be omitted for the sake of brevity.

In the example of the invention shown in FIG. 3, an auxiliary voltage source 27 is provided which is supplied with a predetermined positive DC voltage from an auxiliary voltage source T1. This auxiliary voltage source terminal 27 is connected to the cathode of return current processing diode 19. Another auxiliary voltage source terminal 28 is provided, which is supplied with a predetermined negative DC voltage from another auxiliary voltage source T2 and connected to the anode of return current processing diode 20.

In this example of the invention, the auxiliary voltage sources T1 and T2 are formed as follows. A tertiary winding 25c and a biquadratic winding 25d are provided in connection with the voltage source transformer 25, which forms the voltage source circuit 24. One end of tertiary winding 25c is connected to the anode of a rectifying diode 29 whose cathode is connected to the voltage source terminal 10 and also to the other end of tertiary winding 25c through a smoothing capacitor 30. The connection point between the capacitor 30 and tertiary winding 25c is connected to the auxiliary voltage source terminal 27. While, one end of biquadratic winding 25d is connected to the cathode of a rectifying diode 31 whose anode is connected to the voltage source terminal 15 and also to the other end of biquadratic winding 25d through a smoothing capacitor 32. The connection point between the capacitor 32 and biquadratic winding 25d is connected to the auxiliary voltage source terminal 28. In this case, they are so selected that the voltages across the smoothing capacitors 30 and 32 become the sum of the forward drop voltage $V_f$ of the diode and the saturation voltage $V_{sat}$ between the collector and emitter of the transistor, namely $V_f+V_{sat}$. Thus, the voltage $+V_{cc}-(V_f+V_{sat})$, which is lower than the voltage $+V_{cc}$, applied to the voltage source terminal 10, by $V_f+V_{sat}$, is applied to the auxiliary voltage source terminal 27, and the voltage $-V_{cc}+(V_f+V_{sat})$, which is higher than the voltage $-V_{cc}$, applied to the voltage source terminal 15, by $V_f+V_{sat}$, is applied to the auxiliary voltage source terminal 28. The other circuit construction of the example shown in FIG. 3 is substantially the same as that shown in FIG. 1.

With the example of the invention thus formed as shown in FIG. 3, when an aural signal is supplied to the input terminal 1, the PWM signal shown in FIG. 2A is applied to the bases of transistors 17 and 18. Thus, these transistors 17 and 18 are made ON and OFF alternately to produce, at the connection point between their emitters i.e. output terminal, a signal which corresponds to the amplified PWM signal and which is in turn fed through the low pass filter 21 to the speaker 22. Thus, the aural signal fed to the input terminal 1 is reproduced as a sound from the speaker 22.

With the example of the invention shown in FIG. 3, when the current I1 shown in FIG. 2B flows through the transistor 17, the level of output voltage VO becomes $+V_{cc}-V_{sat}$ as shown in FIG. 2H. When the current I2 shown in FIG. 2C flows through the return current processing diode 19, since the voltage from the auxiliary voltage source T1 is $+V_{cc}-(V_f+V_{sat})$, the level of output voltage VO becomes $+V_{cc}-(V_f+V_{sat})+V_f=+V_{cc}-V_{sat}$ as shown in FIG. 2H. When the current I3 shown in FIG. 2D flows through the transistor 18, the level of output voltage VO becomes $-V_{cc}+V_{sat}$ as shown in FIG. 2H. Further, when the current I4 shown in FIG. 2E flows through the return current processing diode 20, since the voltage from the auxiliary voltage source T2 is $-V_{cc}+(V_f+V_{sat})$, the level of output voltage VO becomes $-V_{cc}+(V_f+V_{sat})-V_f=-V_{cc}+V_{sat}$ as shown in FIG. 2H. That is, according to the invention, no step appears in the waveform of output voltage VO.

As described above, according to the present invention, the amplitude of output voltage VO when the current I2 flows through the return current processing diode 19 becomes the same as the amplitude $+V_{cc}-V_{sat}$, which is the amplitude of output voltage VO when the current I1 flows through the transistor 17, as shown in FIG. 2H. Also, the amplitude of output voltage VO when the current I4 flows through the return current processing diode 20 becomes the same as the amplitude $-V_{cc}+V_{sat}$, which is the amplitude of output voltage VO when the current I3 flows through the transistor 18, as shown in FIG. 2H. That is, the waveform of the output signal in the amplitude direction becomes linear. Therefore, according to the present invention, the distortion in the output signal, which is caused by the non-linear amplitude of the output signal in the prior art, can be improved.

Other examples of the invention will be described with reference to FIGS. 4 and 5 in which the elements and parts corresponding to those in FIG. 3 are marked with the same references and their description will be omitted.

In the example of the invention shown in FIG. 3, the transistors 17 and 18, which are the switching elements and form the switching circuit, are of emitter follower type and connected in the form of the push-pull manner. However, in the example shown in FIG. 4, the switching circuit is formed of transistors of the collector follower type, and in the example shown in FIG. 5, the switching circuit is formed of source follower type FETs (field effect transistors).

In the example of FIG. 4, the collector of transistor 3 is connected to the connection point between the bases of NPN and PNP type transistors 33 and 34, which connection point is connected to the voltage source terminal 10 through a resistor 35. The collector of transistor 33 is connected also to the voltage source terminal 10. The emitters of transistors 33 and 34 are connected together to the base of PNP type transistor 17a which serves as the switching element. The collector of transistor 34 is connected to the voltage source terminal 10 through a power source such as a battery 36 which serves to set a bias. While, the collector of transistor 4 is connected to the connection point between bases of PNP and NPN type transistors 37 and 38 which connection point is connected through a resistor 39 to the voltage source terminal 15. The collector of transistor 37 is connected to the voltage source terminal 15. The emitters of transistors 37 and 38 are connected together to the base of NPN type transistor 18a which serves as the switching element. The collector of transistor 38 is connected to the voltage source terminal 15 through a power source such as a battery 40 which sets a bias. The connection point between the bases of transistors 37 and 38 is connected through a series connection of two diodes 41 and 42 to the connection point between the bases of transistors 33 and 34. The connection point between diodes 41 and 42 is connected to the connection point of the collectors of transistors 17a and 18a. This connection point of the collectors of transistors 17a and 18a or output terminal is connected to the connection point of return current processing diodes 19 and 20, and also to the load resistor 22 through the low pass filter 21. The emitter of transistor 17a is connected to the voltage source terminal 10, while the emitter of transistor 18a is connected to the voltage source terminal 15. The other circuit construction of the example shown in FIG. 4 is substantially same as that shown in FIG. 3.

In the example of the invention shown in FIG. 4, the switching circuit is formed of the pair of the emitter-grounded type transistors, which are connected in the push-pull manner, and low output type drive circuits are used. Thus, it will be easily understood that the example of the invention shown in FIG. 4 operates with the same effect as that of FIG. 3.

In the example of the invention shown in FIG. 5, the collector of transistor 3 is connected to the cathodes of diodes 43 and 44 and the anode of diode 43 is connected to the connection point of the bases of NPN and PNP type transistors 45 and 46, which connection point is connected through a resistor 47 to the voltage source terminal 10. The anode of diode 44 is connected to the collector of transistor 46 which collector is connected to the voltage source terminal 10 through a power source such as a battery 48 which sets a bias. The emitters of transistors 45 and 46 are connected together to the gate of FET 17b which serves as the switching element. While, the collector of transistor 4 is connected to the anodes of diodes 49 and 50. The cathode of diode 49 is connected to the connection point between the bases of PNP and NPN type transistors 51 and 52 which connection point is connected through a resistor 53 to the voltage source terminal 15 to which the collector of transistor 51 is also connected. The cathode of diode 50 is connected to the collector of transistor 52 whose collector is connected to the voltage source terminal 15 through a power source such as a battery 54 for setting a bias. The emitters of transistors 51 and 52 are connected together to the gate of FET 18b which serves as the switching element. The sources of FETs 17b and 18b are connected to the voltage source terminals 10 and 15, respectively, and the drain of FET 17b is connected to the drain of FET 18b through a series connection of return current blocking diodes 55 and 56. The connection point between diodes 55 and 56 is connected to the connection point of return current processing diodes 19 and 20 and also to the load resistor 22 through the low pass filter 21. The other circuit construction of the example shown in FIG. 5 is substantially the same as that shown in FIG. 3.

In the example of FIG. 5, the switching circuit is formed of pair of FETs of the source-grounded type which are connected in a push-pull manner. Therefore, it will be easily understood that the example of the invention shown in FIG. 5 operates with the same effect as that of FIG. 3. In the example of FIG. 5, however, when the saturation voltage of FETs 17b and 18b is taken as $V_{sat}$, the output voltage at the output point i.e. connection point of diodes 55 and 56 becomes $+V_{cc}-(V_{sat}+V_f)$ while the current I1 flows through the FET 17b and becomes $-V_{cc}+(V_{sat}+V_f)$ while the current I3 flows through the FET 18b. Accordingly, the auxiliary voltage sources T1 and T2 are so selected that $+V_{cc}-(V_{sat}+V_f)$ and $-V_{cc}+(V_{sat}+V_f)$ are applied to the auxiliary voltage source terminals 27 and 28, respectively.

It will be apparent that many modifications and variations could be effected by one skilled in the art without departing from the spirits or scope of the novel concepts of the present invention so that the scope of the invention should be determined by the appended claims only.

I claim as my invention

1. A pulse width modulated signal amplifier comprising, a transformer having primary, secondary, tertiary and biquadratic windings and a magnetic core, the primary winding being supplied with an AC voltage thereacross, first and second rectifier circuits connected across said secondary winding, the outputs of said first and second rectifier circuits forming first and second DC voltage terminals, respectively, third and fourth rectifier circuits connected to said tertiary and biquadratic windings, respectively, the outputs of said third and fourth rectifier circuits forming third and fourth DC voltage terminals, respectively, first and second switching transistors each having a control electrode and the main current path connected in series between said first and second DC voltage terminals and their connection point connected to an output terminal, signal input means for supplying a pulse width modulated signal to the control electrodes of said first and second switching transistors, low pass filter means having an input connected to said output terminal and an output to be connected to a load, a first circuit means including a first diode means and connected between said third DC voltage terminal and said output terminal, and a second circuit means including a second diode means and connected between said fourth DC voltage terminal and said output terminal.

2. A pulse width modulated signal amplifier according to claim 1, in which said low pass filter means includes a series choke coil and a parallel capacitor.

3. A pulse width modulated signal amplifier according to claim 1, in which said first and second switching transistors comprise a pair of complementary transistors, each connected in emitter follower circuit.

4. A pulse width modulated signal amplifier according to claim 1, in which said first and second switching transistors comprise a pair of complementary transistors, each connected in grounded emitter circuit.

5. A pulse width modulated signal amplifier according to claim 1, in which said first and second switching transistors comprise a pair of MOS field effect transistors, each connected in source follower fashion.

* * * * *